United States Patent

Petro et al.

[11] Patent Number: 5,260,236
[45] Date of Patent: Nov. 9, 1993

[54] UV TRANSPARENT OXYNITRIDE DEPOSITION IN SINGLE WAFER PECVD SYSTEM

[75] Inventors: William G. Petro, San Jose; Farhad Moghadam, Los Gatos, both of Calif.

[73] Assignee: Intel Corporation, Santa Clara, Calif.

[21] Appl. No.: 840,855

[22] Filed: Feb. 25, 1992

Related U.S. Application Data

[63] Continuation-in-part of Ser. No. 711,935, Jun. 7, 1991, abandoned.

[51] Int. Cl.⁵ .............................. H01L 21/205
[52] U.S. Cl. .................... 437/241; 148/DIG. 114
[58] Field of Search .............. 437/241; 156/643; 134/1; 204/192.23; 118/723, 715, 50.1; 148/DIG. 114

[56] References Cited

U.S. PATENT DOCUMENTS

| | | | |
|---|---|---|---|
| 4,374,698 | 2/1983 | Sanders et al. | 156/643 |
| 4,532,022 | 7/1985 | Takasaki et al. | 204/192.23 |
| 4,618,541 | 10/1986 | Forouchi et al. | 437/241 |
| 4,657,616 | 4/1987 | Benzing et al. | 134/1 |
| 4,786,352 | 11/1988 | Benzing | 134/1 |
| 4,987,856 | 1/1991 | Hey et al. | 118/723 |
| 5,006,192 | 4/1991 | Deguchi | 118/723 |

FOREIGN PATENT DOCUMENTS

0025717  3/1981  Japan .................... 437/241

OTHER PUBLICATIONS

In Parent Case Ser No. 711935 Claassen et al., "Characterization of Silicon-Oxynitride Films Deposited by Plasma-Enhanced CVD", J. Electrochem Soc., vol. 133, No. 7, pp. 1458-1464, Jul. 1986.

Primary Examiner—Mary Wilczewski
Attorney, Agent, or Firm—Blakely, Sokoloff, Taylor & Zafman

[57] ABSTRACT

A high density, high frequency, plasma-enhanced chemical vapor deposition (PECVD) process for depositing a passivation layer on a semiconductor integrated circuit wafer. The wafer rests on a grounded electrode while a second electrode disperses gases over the wafer. The second electrode disperses the gases in the same manner as a showerhead. An radio-frequency (RF) potential applied to the showerhead electrode causes the gases to react under specific temperature, pressure, and electrode spacing conditions. Furthermore, the present invention is a low particulate process. The process forms a film of high UV transparency. The chamber is cleaned after removal of the wafer, and gas lines are evacuated. This results in a low particle process. The film have low within-wafer and wafer-to-wafer variation of thickness and refractive index, low pattern sensitivity of thickness of the deposited film, high deposition rate, high moisture resistance (low wet etched rate), low density of SiH and NH bonds, no pinholes, low stress, good sidewall step average, and high resistance to film cracking.

10 Claims, 2 Drawing Sheets

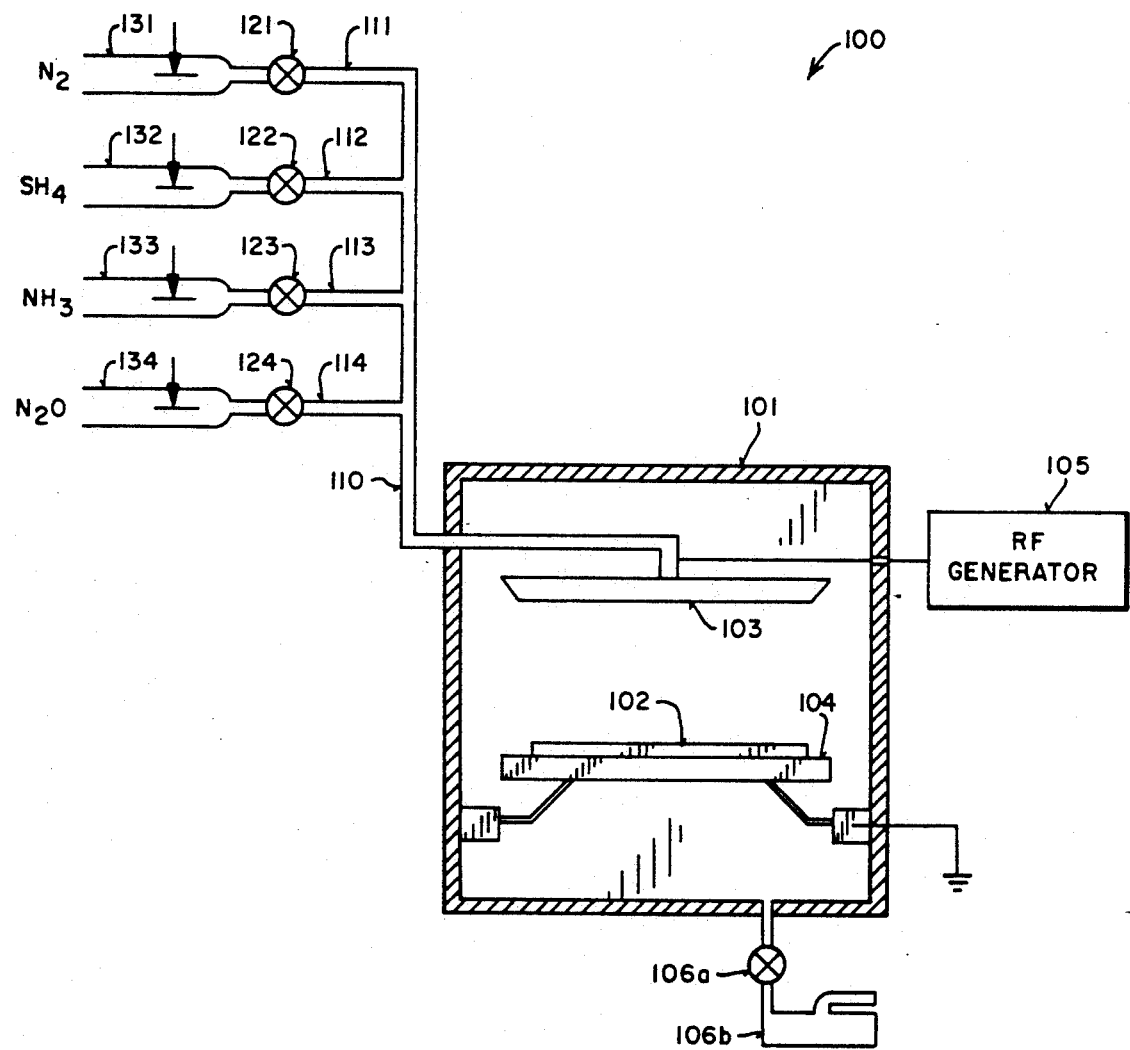

FIG_2
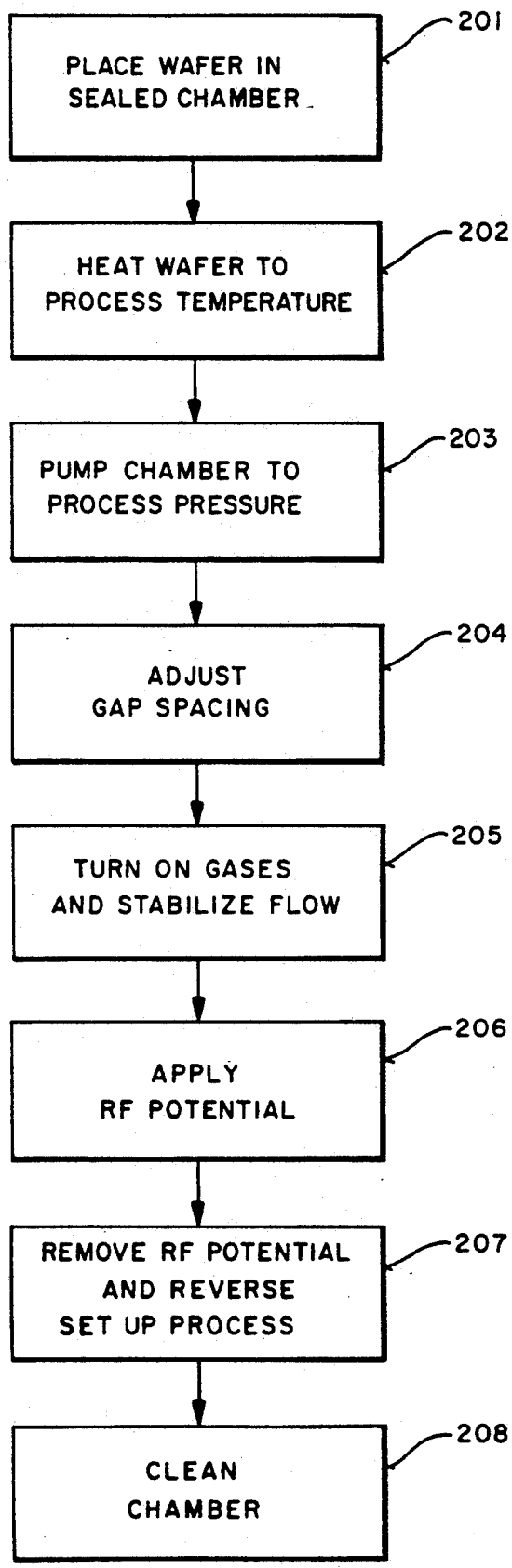

UV TRANSPARENT OXYNITRIDE DEPOSITION IN SINGLE WAFER PECVD SYSTEM

This is a continuation-in-part of co-pending U.S. patent application entitled "UV Transparent Oxynitride Deposition in Single Wafer", Ser. No. 07/711,935, filed on Jun. 7, 1991, now abandoned.

FIELD OF THE INVENTION

The present invention relates to the field of semi-conductor fabrication; particularly to the deposition of a passivation layer on an integrated circuit wafer.

BACKGROUND OF THE INVENTION

An erasable and programmable read-only memory (EPROM) is erased by exposing it to ultraviolet (UV) light. To allow for such erasure, the EPROM must utilize a passivation layer which is sufficiently transparent to allow passage of the UV light. A number of EPROMs use oxynitride films for their passivation layer. These films are often deposited using a chemical vapor deposition (CVD) process wherein solid films are formed on an integrated circuit wafer by the chemical reaction of vapor phase chemicals (reactants) that contain the required constituent gases. Three major CVD processes exist: atmospheric pressure CVD (APCVD), low pressure CVD (LPCVD), and plasma-enhanced CVD (PECVD). APCVD and LPCVD systems are characterized by the requisite pressure for the deposition. Typically, these system use thermal energy to promote chemical reactions responsible for the film deposition. PECVD systems, however, are categorized by pressure and by its method of energy input. PECVD systems do not rely solely on thermal energy, but instead use a radio-frequency (RF) induced glow discharge plasma to transfer energy into the reactant gases, allowing the integrated circuit wafer to remain at a lower temperature than in APCVD or LPCVD processes.

Typically, in PECVD systems, the films are deposited in low frequency, lower power density batch reactors. Batch reactors accommodate a large number of wafers at the same time. In low power density processes, the RF power is distributed over large numbers of wafers, wherein each wafer is subjected to a low power density plasma. Under these conditions, the deposition time is long. Low frequency processes also have drawbacks. In low frequency processes, the films tend to be very sensitive to device pattern. In other words, a different process is required to fabricate each different type of devices, where each wafer contains different devices. Secondly, low frequency processes tend to produce films which are non-uniform across the wafer. The question of uniformity also arises where the wafer has a variety of devices on it with a varying structure density. Batch systems also have a higher wafer-to-wafer thickness nonuniformity as compared to single-wafer systems.

The present invention avoids these drawbacks by using a high frequency, high RF power density single wafer PECVD process to fabricate a passivation layer of oxynitride on EPROMs. The present invention operates on single wafers, irrespective of device type, to produce a uniform passivation film. Moreover, the present invention has the advantage of being a low particulate process.

SUMMARY OF THE INVENTION

A high density, high frequency, single wafer, plasma-enhanced chemical vapor deposition (PECVD) process for depositing a passivation layer on an integrated circuit semi-conductor wafer is described. In one embodiment, the wafer is placed on a first electrode, a grounded succeptor, in a vacuum chamber. The wafer is then heated to a process temperature. In the currently preferred embodiment, the process temperature ranges from 350°–430° C. Next, the vacuum chamber is pumped to a low pressure. The pressure range for the currently preferred embodiment is 4–6 torr.

After low pressure has been achieved, a gas mixture consisting of nitrogen, silane, ammonia and nitrous oxide is introduced to the vacuum chamber through a second electrode which is designed like a showerhead. The gas mixture flows directly on top of the wafer. A radio-frequency (RF) potential is then applied to the showerhead electrode, causing excitation and ionization of the gas mixture leading to chemical reaction and the formation of a passivation film on the wafer.

The films formed with the described process simultaneously exhibit low particle densities, high UV transparency, low within-wafer and wafer-to-wafer thickness variations, low pattern sensitivity, high moisture resistance, no pinholes, low stress, good step coverage, and low bound hydrogen content. The gas mixture flows through the showerhead electrode from a gas manifold. Each gas enters the gas manifold from a separate gas line. Each gas line utilizes two control valves which operate to minimize particle production in the vacuum chamber.

BRIEF DESCRIPTION OF THE DRAWINGS

The present invention will be understood more fully from the detailed description given below and from the accompanying drawings of the preferred embodiments of the invention, which, however, should not be taken to limit the invention to the specific embodiments, but are for explanation and understanding only.

FIG. 1 illustrates a single wafer plasma-enhanced chemical vapor deposition (PECVD) system.

FIG. 2 illustrates a flow diagram of the passivation layer deposition process using a PECVD system.

DETAILED DESCRIPTION OF THE INVENTION

A process for depositing a passivation layer on an integrated circuit is described. In the following description, numerous specific details are set forth such as specific process steps, film thicknesses, etc., in order to provide a thorough understanding of the present invention. It will be obvious, however, to one skilled in the art that the present invention may be practiced without these specific details. In other instances, well-known processing steps have not been described in detail to avoid unnecessarily obscuring the present invention.

The following detailed description depicts one portion of the backend of a fabrication process for a semi-conductor integrated circuit. Passivation films are deposited on electrically programmable read-only memory (EPROM) devices and are utilized to erase the EPROM. Typically, an EPROM employs floating gates, that is, polysilicon members completely surrounded by an insulator. Electrical charge is transferred into the floating gate through a variety of mechanisms, such as avalanche injection, channel injection, Fowler- Nordheim tunnelling, hot electron injection from the substrate, etc. These memories are erased by exposure to ultraviolet (UV) radiation. The passivation film is deposited on top of the memory device. Therefore, the passivation film must be transparent enough to allow UV light to pass through the film so that the device may be erased. In the currently preferred embodiment, the passivation film (layer) is deposited using a plasma-enhanced chemical vapor deposition (PECVD) system 100 as shown in FIG. 1.

Referring to FIG. 1, PECVD system 100 is a single wafer load-locked system. PECVD system 100 utilizes chamber 101 as the environment for depositing a passivation film on a semiconductor wafer, such as wafer 102. The composition of the passivation film is silicon oxynitride, which is a mixture of silicon, oxygen, and nitrogen. Hydrogen is a by-product of the film deposition process. A wafer, such as wafer 102, once inside chamber 101 can be subjected to temperature and pressure variation by PECVD system 100. Temperature is varied and regulated by a heater and temperature sensor respectively (not shown). Pressure is controlled and regulated by pressure control valve 106A and vacuum pump 106B.

Wafer 102 rests on an electrode, succeptor 104. In the currently preferred embodiment, succeptor 104 is electrically grounded. Above wafer 102 is a second electrode, showerhead 103. Showerhead 103 has a special showerhead design. Showerhead 103 has holes in it and distributes gases over the top surface of wafer 102 in the same manner as a showerhead. The distance between showerhead 103 and succeptor 104 is referred to as the electrode, or gap, spacing.

Gases enter chamber 101 through showerhead 103. Showerhead 103 is supplied by gas manifold 110. Gas manifold 110 is suppled by gas lines 111, 112, 113, and 114. Nitrogen ($N_2$) flows through gas line 111 into gas manifold 110. The flow of nitrogen is controlled by control valves 121 and 131. Silane ($SiH_4$) flows through gas line 112 into gas manifold 110. The flow of silane is controlled by control valves 122 and 132. Ammonia ($NH_3$) flows through gas line 113 into gas manifold 110. The flow of ammonia is controlled by control valves 123 and 133. Nitrous Oxide ($N_2O$) flows through gas line 114 into gas manifold 110. The flow of nitrous oxide is controlled by control valves 124 and 134.

As shown in FIG. 1, RF generator 105 is coupled to showerhead 103. RF generator 105 applies an RF potential to showerhead 103 which sets up a potential between the two electrodes, showerhead 103 and succeptor 104. This potential allows wafer 102 to be exposed to an RF plasma while the four reactant gases (nitrogen, silane, ammonia, and nitrous oxide) are introduced into chamber 101. The RF potential causes the four gases to react and form the passivation layer.

Hence, FIG. 1 discloses a plasma-enhanced chemical vapor deposition system, PECVD system 100, which produces a silicon oxynitride passivation film on a semiconductor wafer. The properties of this passivation film are critical. Namely, the UV transmission, where the UV wavelength equals 254 nm (nanometers), and the stress of the film are critical to the device properties. Secondarily, the refractive index, uniformity and wet etch rate (moisture permeability) which result from the process are of equal concern. Finally, the hydrogen content in the film is important. The film stress is strongly affected by RF power (increased RF power results in increased compressive stress). Increased $SiH_4$ flow causes a more tensile film.

The refractive index is strongly affected by $SiH_4$ and gap spacing—increasing $SiH_4$ increases refractive index, and increasing gap reduces refractive index. The wet etch rate is affected by RF, $SiH_4$, gap and $N_2O$. Increasing RF and/or $SiH_4$ decreases the wet etch rate, while increasing gap or $N_2O$ increases the wet etch rate. Increasing the gap also improves the thickness uniformity, while increased $SiH_4$ reduces the UV transmittance.

Referring to FIG. 2, the passivation film deposition process is depicted. During stage 201 of the process, wafer 102 is placed into chamber 101 face up on succeptor 104. Above wafer 102 is the second electrode, showerhead 103, through which the gases are distributed. Then chamber 101 is sealed. During stage 202, the sealed chamber 101 is pumped to the process pressure using vacuum pump 106B. In the currently preferred embodiment, the process pressure is between 4–6 Torr. The temperature is stabilized to the process, or wafer, temperature. In stage 203, wafer 102 is heated to the process temperature. In the currently preferred embodiment, the process temperature, referred to as wafer temperature, is between 350°–430° C. Once temperature and pressure parameters have been set, the electrode spacing (gap) between grounded succeptor 104 and showerhead 103 is adjusted to the correct spacing, stage 204. In the currently preferred embodiment, the electrode spacing or gap is adjusted to approximately 300–600 mils (thousands of an inch).

Once the system parameters have been set, the four gases (nitrogen, silane, ammonia and nitrous oxide) are turned on and stabilized at their individual flow rates (stage 205). In the currently preferred embodiment, the flow rates are as follows: nitrogen ($N_2$) with a flow rate of 500–4000 standard cubic centimeter/minute (sccm); silane ($SiH_4$) with range 50–150 sccm; ammonia ($NH_3$) with a flow rate of 40–150 sccm; and nitrous oxide ($N_2O$) with a range 50–150 sccm. The gases are mixed into gas manifold 110 which leads into chamber 101. At stage 205, all of the parameters have been set.

The optimization of all critical film properties (UV transmissivity, stress, wet etch rate, deposition rate, and thickness uniformity) requires tight control of processing parameters, particularly the gas flows. Silane ($SiH_4$) flow strongly affects UV transmissivity and wet etch rate, while nitrous oxide ($N_2O$) flow strongly affects wet etch rate. The process window required to achieve UV transmissivity greater than 90% and wet etch rate less than 800 Å/min (6:1 buffered oxide etch) consists of $SiH_4$ flow between 70 and 80 sccm and $N_2O$ flow between 40 and 50 sccm. For $SiH_4$ flow greater than 80 sccm, the UV transmissivity drops below 90%, and for $N_2O$ flow greater than 50 sccm, the wet etch rate increases to greater than 800 Å/min. For flows below the lower limits, the deposition rate drops below 5200 Å/min.

Stage 206 involves the application of the RF potential. This is accomplished by switching on the RF generator 105. RF generator 105 is a high frequency generator, operating at a frequency of 13.56 MHz. When RF generator 105 is switched on, Showerhead 103 is placed at high RF potential. In the currently preferred embodiment, the power from RF generator is between 200–500 watts. The gases flow for a few seconds until they achieve a stable flow. The RF potential creates an RF field which supplies energy to the gas mixture within chamber 101. The gases become excited and form a glow discharge or plasma (The plasma refers to the partially ionized gas, while the glow discharge refers to the plasma maintained over the specific pressure range (4–6 Torr)). The plasma, in turn, transfers energy into the reactant gases to enhance the deposition of the passivation film onto wafer 102. Since the PECVD system 100 is a high frequency system, the gases are more efficiently ionized once the plasma is struck. Using silane ($SiH_4$), nitrous oxide ($N_2O$), ammonia ($NH_3$) and nitrogen ($N_2$) as reactant gases, a thin film of silicon oxynitride ($Si_xO_yN_z$) is deposited on wafer 102. Thus, PECVD system 100 produces a passivation layer on wafer 102.

The process concludes stage 207 by reversing the order of steps 201–206. RF generator 105 is turned off. The gases are turned off, and wafer 102 is removed from the chamber.

Finally, stage 208 involves cleaning chamber 101. Cleaning is done by generating a plasma with certain gases in chamber 101, when it is empty. In other words, only succeptor 104 and showerhead 103 are in chamber 101. The gases that are used are those that would tend to etch or react strongly with silicon oxides or nitrides. These gases are usually flourine containing gases, such as nitrous flouride, $NF_3$. It is normally mixed with nitrous oxide, $N_2O$. A plasma is generated with those two gases to create pre-flourine and oxygen species. Since oxygen tends to react with silicon to form silicon dioxide. $SiO_2$, the oxygen bonds to residual silicon. The flourine tends to etch off and break-up the silicon dioxide. Subsequently, these gases and their by-products are pumped away and cleaning is complete. The process depicted in FIG. 2 is a low particulate process, wherein very low particle levels are generated on wafer 102. This is an improvement over previous approaches.

Typically, many particles are generated during the process. Particles are formed during the deposition process. The majority of the deposition occurs on wafer 102. Deposition occurs also on showerhead 103 because it is exposed to the RF plasma. Hence, some film tends to be deposited on all surfaces. Even after cleaning, stage 208, some residual film remains on the walls of chamber 101. When a new wafer is placed in chamber 101 and a burst of gas flows into chamber 101, those flakes or residual deposits loosen up and fall on to the wafer. These particles, or "clumps" of material, can interfere with the operation device if one or more of them becomes part of the passivation film. For instance, these particles can impair the UV erasability due to blockage of some memory cells during the erase operation. Particles can have a wide range of detrimental effects. Thus, particle minimization is important. The effects of any of the residual background film or contamination can be reduced by reducing the amount the gas that stirs up the residual material.

Particle minimization can be accomplished by operating showerhead 103 in the proper manner. One method to combat the problem is to evacuate gas lines 111, 112, 113 and 114 before loading wafers into process chamber 101. Control of the gas flow is accomplished by valves 131, 132, 133, 134, 121, 122, 123 and 124 which adjust flow rates of their respective gases. Each gas passes through the valve and continues into gas manifold 110 where all four gas lines 111, 112, 113 and 114 meet. Gas manifold 110 outputs the gases in chamber 101. Gases are pumped out of chamber 101 by vacuum pump 106B. When PECVD system 100 is idle (i.e., no processing occurring), chamber 101 is under vacuum and gas valves 121, 122, 123, and 124 are closed. When the deposition process is to be utilized, wafer 102 will be brought into the chamber, and the process described above begins. At some point it will be necessary to open gas control valves 121, 122, 123, and 124. The gases are at fairly high pressure (5–15 psi). The pressure in chamber 101 is 4–6 Torr. This is a large pressure differential. When one valve is opened, a very large burst of gas initially flows very quickly, otherwise known as turbulence.

The burst of gas can stir up particles and deposit them on wafer 102. One method to minimize turbulence is to undertake the following procedure after circulation of the chamber clean process stage. Each mass flow controller (MFC) valve (131, 132, 133, 134) is closed, the gas shutoff valves (121, 122, 123, 124) are opened, and the section of gas line between the MFC valve and the chamber is evacuated. The shutoff valves are then closed, and the next wafer is placed in the chamber (step 201). During gas stabilization step 205, the shutoff valves are opened and the MFC valves are slowly opened in a step-wise fashion to their final setpoint valves. This allows the gases to be slowly introduced and prevents large bursts of the gases. The elimination of gas bursts minimizes the possibility of particles being loosened up and falling onto wafer 102.

Thus, a plasma-enhanced chemical vapor deposition process for depositing a passivation layer on a semiconductor wafer is described.

We claim:

1. In the fabrication of a semiconductor wafer, a plasma-enhanced chemical vapor deposition (PECVD) process for depositing a passivation layer on said wafer, said process comprising the steps of:
    a) positioning said wafer on a first electrode in a vacuum chamber, wherein said wafer is heated to a process temperature and
    b) introducing a gas mixture of four gases into said vacuum chamber through a second electrode, said four gases being nitrogen, silane, ammonia and nitrous oxide, wherein the flow rate of nitrogen is between 500 and 4000 standard cubic centimeter/minute (sccm), the flow rate of silane is between 70 and 80 sccm, the flow rate of ammonia is between 50 and 150 sccm, and the flow rate of nitrous oxide is between 40 and 50 sccm, said second electrode being located a distance above said first electrode, said second electrode using a showerhead configuration to disperse said gas mixture; and
    c) applying a radio-frequency (RF) potential to said second electrode for a fixed amount of time such that said four gases in said gas mixture react to form said passivation layer, said RF potential being generated by an RF power supply.

2. The process as in claim 1 wherein said process temperature range is from 350°–430° C.

3. The process as in claim 1 wherein said RF power is between 200 and 500 Watts.

4. The process as in claim 1 wherein said pressure range is from 4–6 Torr.

5. The process as in claim 1 wherein said distance is in the range of 300–600 mils.

6. The process as in claim 1 wherein said positioning step includes the steps of:
    positioning said wafer on a first electrode in a vacuum chamber, said first electrode being a succeptor;
    evacuating said vacuum chamber to a pressure range;

heating said wafer to a process temperature range; and stabilizing said process temperature to said process temperature range.

7. In the fabrication of a semiconductor wafer, a high RF power density, high frequency, plasma-enhanced chemical vapor deposition (PECVD) process for depositing a passivation layer on said wafer, said process comprising the steps of:
- a) positioning said wafer on a first electrode in a vacuum chamber, wherein said chamber is at a process pressure, said wafer being heated to a process temperature, said process temperature ranging from 350°-430° C., said process pressure ranging from 4 to 6 Torr;
- b) introducing a gas mixture of four gases into said vacuum chamber through a second electrode, said four gases being nitrogen, silane, ammonia and nitrous oxide, wherein the flow rate of nitrogen is between 500 and 4000 sccm, the flow rate of silane is between 70 and 80 sccm, the flow rate of ammonia is between 50 and 150 sccm, the flow rate of nitrous oxide is between 40 and 50 sccm, said second electrode being located a distance above said first electrode, said distance in the range of 300-600 mils, said second electrode using a showerhead configuration to disperse said gas mixture; and
- c) applying a radio-frequency (RF) potential to said second electrode for a fixed amount of time, such that said four gases in said gas mixture react to form said passivation layer, said RF potential being generated by an RF power supply, said RF power being from 200 to 500 Watts.

8. The process as defined in claim 7 wherein said chamber has a gas line for each of the gases in said gas mixture, and wherein each gas line has a gas shut off valve and a mass flow controller (MFC) valve, said process comprising the steps of:

closing the MFC valves;

opening the gas shut off valves;

evacuating the gas input lines between said chamber and said MFC valves;

closing the shut off valves; and repeating steps a)–c), including the step of opening the gas shut off valves and MFC valves slowly to prevent large bursts of gases when introducing gases into said chamber, such that a PECVD process is performed on the next wafer.

9. The method defined in claim 8 further comprising the step of cleaning said chamber with $NF_3$ and $N_2O$ plasma after said deposition.

10. The process as in claim 7 wherein said positioning step includes the steps of:

positioning said wafer on a first electrode in a vacuum chamber, said first electrode being a susceptor;

evacuating said vacuum chamber to said pressure range;

heating said wafer to said process temperature range; and stabilizing said process temperature to said process temperature range.

* * * * *

UNITED STATES PATENT AND TRADEMARK OFFICE
CERTIFICATE OF CORRECTION

PATENT NO. : 5,260,236
DATED : Nov. 9, 1993
INVENTOR(S) : William G. Petro, et al It is certified that error appears in the above-indentified patent and that said Letters Patent is hereby corrected as shown below:

Column 6, line 38   Insert --said chamber is at a process pressure--

Signed and Sealed this

Nineteenth Day of September, 1995

Attest:

BRUCE LEHMAN

Attesting Officer    Commissioner of Patents and Trademarks